(12) United States Patent
Yang

(10) Patent No.: US 7,572,692 B2
(45) Date of Patent: Aug. 11, 2009

(54) COMPLEMENTARY TRANSISTORS HAVING DIFFERENT SOURCE AND DRAIN EXTENSION SPACING CONTROLLED BY DIFFERENT SPACER SIZES

(75) Inventor: Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 11/191,426

(22) Filed: Jul. 27, 2005

(65) Prior Publication Data

US 2005/0263826 A1    Dec. 1, 2005

Related U.S. Application Data

(62) Division of application No. 10/726,326, filed on Dec. 2, 2003, now Pat. No. 6,946,709.

(51) Int. Cl.
    *H01L 21/8238*    (2006.01)
    *H01L 21/336*    (2006.01)

(52) U.S. Cl. .................. 438/199; 438/230; 438/303; 438/592; 438/595

(58) Field of Classification Search .......... 438/184, 438/199, 230, 265, 300, 303, 585, 587, 588, 438/592, 595; 257/E21.64, E21.438, E21.439, 257/E21.626
See application file for complete search history.

(56) References Cited

U.S. PATENT DOCUMENTS 5,898,203 A * 4/1999 Yoshitomi et al. ............ 257/344
5,963,803 A   10/1999 Dawson et al.
6,696,334 B1   2/2004 Hellig et al.
2001/0052648 A1 12/2001 Sakurai et al.

FOREIGN PATENT DOCUMENTS

| JP | 07-066296 | 3/1995 |
|----|-----------|--------|
| JP | WO 99-13507 | 3/1999 |
| JP | 2002-026139 | 1/2005 |

\* cited by examiner

*Primary Examiner*—Hung Vu
(74) *Attorney, Agent, or Firm*—Gibb I.P. Law Firm, LLC; Daniel Schnurmann, Esq.

(57) ABSTRACT

Disclosed is a method of forming an integrated circuit structure having first-type transistors, such as P-type field effect transistors (PFETs) and complementary second-type transistors, such as N-type field effect transistors (NFETs) on the same substrate. More specifically, the invention forms gate conductors above channel regions in the substrate, sidewall spacers adjacent the gate conductors, and source and drain extensions in the substrate. The sidewall spacers are larger (extend further from the gate conductor) in the PFETs than in the NFETs. The sidewall spacers align the source and drain extensions during the implanting process. Therefore, the larger sidewall spacers position (align) the source and drain implants further from the channel region for the PFETs when compared to the NFETs. Then, during the subsequent annealing processes, the faster moving PFET impurities will be restrained from diffusing too far into the channel region under the gate conductor. This prevents the short channel effect that occurs when the source and drain impurities extend too far beneath the gate conductor and short out the channel region.

12 Claims, 5 Drawing Sheets

COMPLEMENTARY TRANSISTORS HAVING DIFFERENT SOURCE AND DRAIN EXTENSION SPACING CONTROLLED BY DIFFERENT SPACER SIZES

CROSS-REFERENCE TO RELATED APPLICATIONS

This application is a division of U.S. application Ser. No. 10/726,326 filed on Dec. 2, 2003 now U.S. Pat. No. 6,946,709.

BACKGROUND OF THE INVENTION

1. Field of the Invention

The present invention generally relates to complementary metal oxide semiconductor (CMOS) and other complementary transistor structures, and more particularly to an improved structure that includes differently sized spacers for the different types of transistors to provide improved spacing of the source and drain extensions.

2. Description of the Related Art

As CMOS devices shrink, the source and drain extensions and junctions are required to be shallower to prevent the undesirable short channel effect. As the consequence of the shallower extensions and junctions, the resistance of the source and drain extensions increases sharply, resulting in lower drive and poorer performance. The current processes form a spacer of the same size for PFET and NFET before junction implants. Because PFET junction/extension dopants, such as boron, diffuse faster than the NFET junction dopant (i.e., As), spacer size is normally determined by the PFET requirement. However, this prevents the NFET's performance from being fully realized. Additionally, the long PFET extension results in a high series resistance. The invention described below addresses these issues.

SUMMARY OF THE INVENTION

The invention provides a method of forming an integrated circuit structure having first-type transistors, such as P-type field effect transistors (PFETs) and complementary second-type transistors, such as N-type field effect transistors (NFETs) on the same substrate. More specifically, the invention forms gate conductors above channel regions in the substrate, sidewall spacers adjacent the gate conductors, and source and drain extensions in the substrate. The sidewall spacers are larger (extend further from the gate conductor) in the PFETs than in the NFETs. The sidewall spacers align the source and drain extensions during the implanting process. Therefore, the larger sidewall spacers position (align) the source and drain implants further from the channel region for the PFETs when compared to the NFETs. Then, during the subsequent annealing processes, the faster moving PFET impurities will be restrained from diffusing too far into the channel region under the gate conductor. This prevents the short channel effect that occurs when the source and drain impurities extend too far beneath the gate conductor and short out the channel region.

The process of forming the sidewall spacers can include forming an oxide liner, where the oxide liner is thicker in the PFETs than in the NFETs. Such oxide liners for the PFETs are formed in a different processing step than oxide liners for the NFETs. Additionally, the process of forming the sidewall spacers can include forming multiple-layer sidewall spacers, wherein the sidewall spacers in the PFETs have more sidewall spacer layers than in the NFETs. Both these processes make the sidewall spacers thicker in the PFETs than in the NFETs. The invention also forms silicide regions between portions of the sidewall spacers and the substrate. The silicide regions are larger in the PFETs transistors than in the NFETs transistors.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
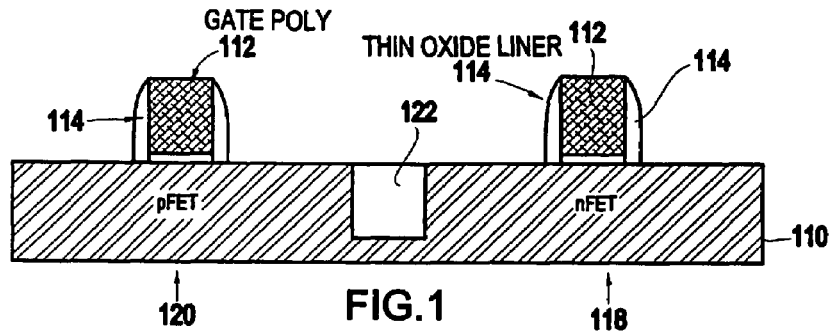
FIG. 1 is a schematic diagram of a partially completed complementary transistor structure according to the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention forms a complementary integrated circuit structure having first-type transistors, such as P-type field effect transistors (PFETs) and complementary second-type transistors, such as N-type field effect transistors (NFETs) on the same substrate. With the invention, the sidewall spacers are larger (extend further from the gate conductor) in the PFETs than in the NFETs. The sidewall spacers align the source and drain extensions during the implanting process. Therefore, the larger sidewall spacers position (align) the source and drain extension implants further from the channel region for the PFETs when compared to the NFETs. Then, during the subsequent annealing processes, the faster moving PFET impurities will be restrained from diffusing too far into the channel region under the gate conductor. This prevents the short channel effect that occurs when the source and drain extension impurities extend too far beneath the gate conductor and short out the channel region.

In other words, the invention forms a narrower NFET spacer than PFET spacer on the same chip so that the NFET extension is shorter. This achieves lower extension resistance. This is possible because As dopant used to form the NFET extension and junction diffuses much slower than the PFET's B dopant.

In addition, the invention forms a shallow silicide in the PFET extension to again reduce extension resistance. This is achieved by forming a recess in the TEOS layer under the PFET gate sidewall spacer. For example, some cobalt can be sputtered into the recess to form a very shallow silicide. As a result of the relatively fast boron diffusion, the extension of the PFET is relatively deeper and the formation of the shallow silicide in the PFET extension will not increase leakage. The size of the recess is modulated by the oxide thickness under the spacer nitride. The thicker the oxide, the larger the recess will be. A thicker oxide is formed under the PFET spacers than that under NFETs, hence a larger recess and larger silicide is formed for the PFETs. Therefore, the silicide region under the PFET devices is longer and closer to the gate conductor than the silicide region under the NFET devices.

Figure 2:
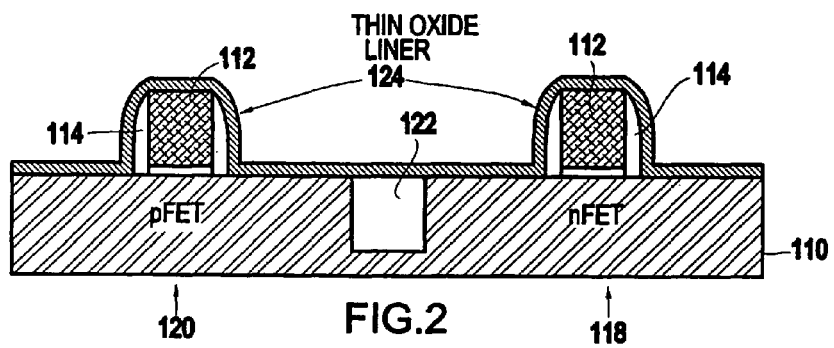
FIG. 2 is a schematic diagram of a partially completed complementary transistor structure according to the invention.
Figure 3:
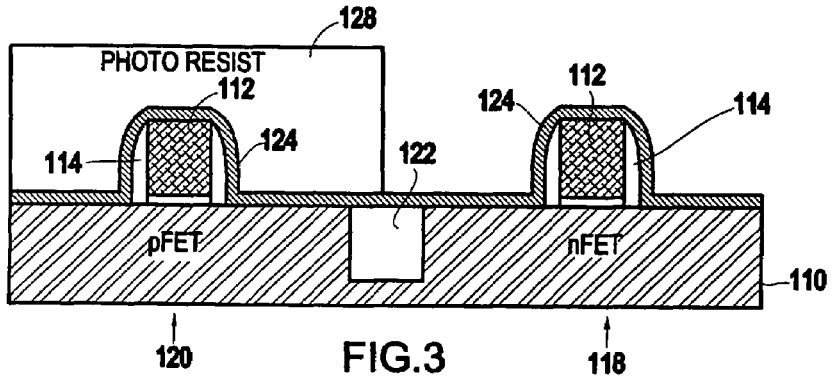
FIG. 3 is a schematic diagram of a partially completed complementary transistor structure according to the invention.
Figure 4:
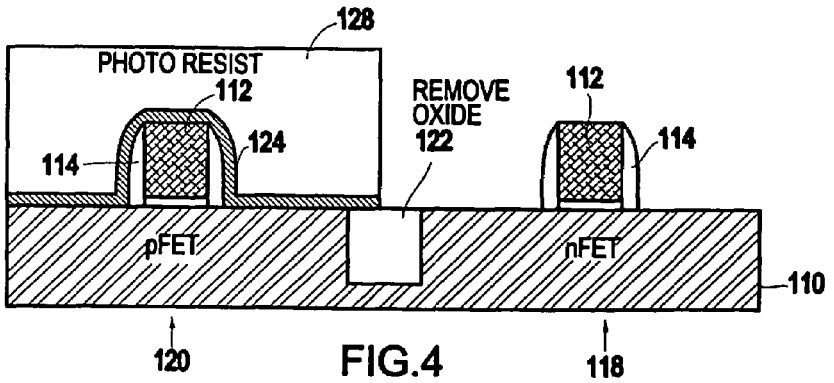
FIG. 4 is a schematic diagram of a partially completed complementary transistor structure according to the invention.

A first embodiment of the invention is shown in FIGS. 1-9. FIG. 1 shows the PFET 120 and NFET 118 devices separated by a shallow trench isolation (STI) region 122 in the substrate 110. The gate conductor 112 is patterned and a thin spacer 114 is formed to offset extension ion implants to the channel. FIG. 2 shows a thin oxide liner 124 (such as 100 A thick LTO) that is deposited over the gate conductors 112 and the thin spacers 114. A protective mask 128, such as a photoresist, is applied and patterned to cover PFET devices 120 in FIG. 3. Then, the thin oxide 124 is removed to the expose NFET devices 118 by either reactive ion etching (RIE) or wet etching chemicals, as shown in FIG. 4. The mask 128 is then removed.

Figure 5:
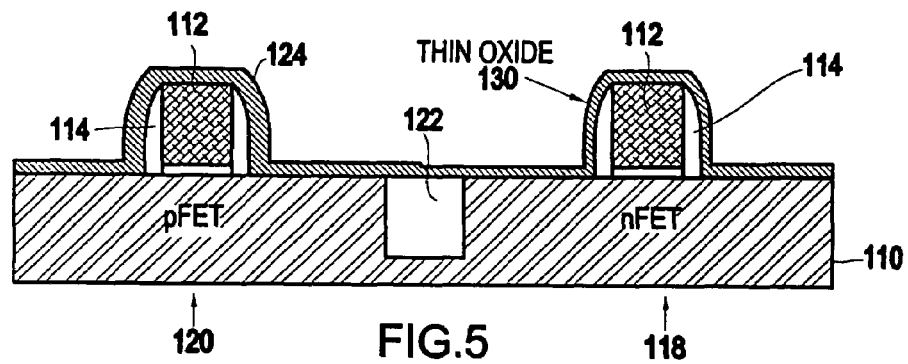
FIG. 5 is a schematic diagram of a partially completed complementary transistor structure according to the invention.
Figure 6:
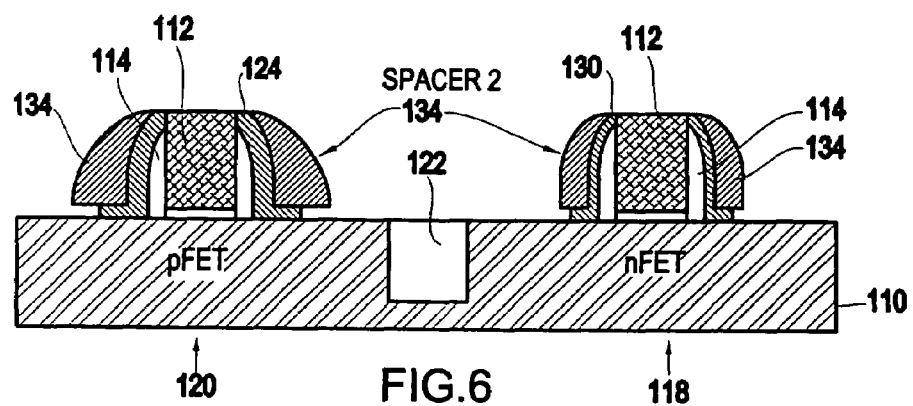
FIG. 6 is a schematic diagram of a partially completed complementary transistor structure according to the invention.

A second thin oxide layer 130, as shown in FIG. 5, (such as 50 A thick LTO) is deposited after the photoresist 128 is removed from the wafer. This process adds thickness to the oxide 124. Therefore, the oxide 124 is thicker than the oxide 130 and the PFET devices 120 have a thicker total oxide layer 124 than the NFET devices 118. FIG. 6 shows a spacer 134 (such as Si3N4) that is formed to offset source and drain ion implants. In this embodiment, total spacers size (thickness) is determined by the combined thicknesses of the spacer 134 along with the oxide 124, 130. Thus, the NFET devices 118 have a thinner total spacer size and hence a shorter extension and lower extension resistance. The source/drain extension implant is made at this point.

Figure 7:
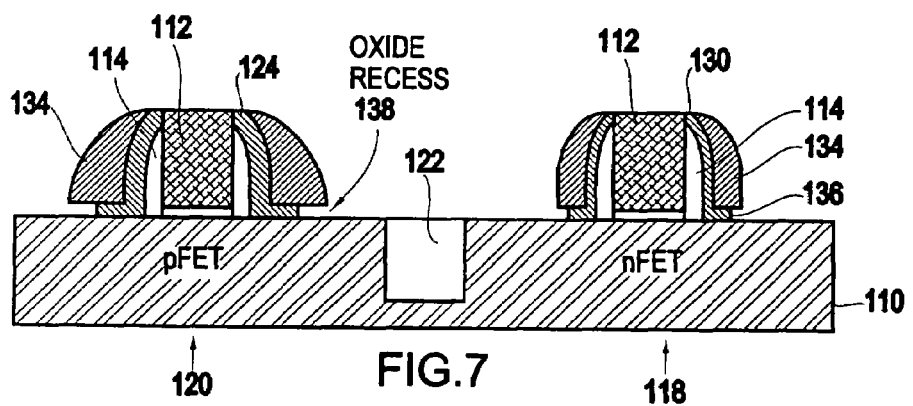
FIG. 7 is a schematic diagram of a partially completed complementary transistor structure according to the invention.
Figure 8:
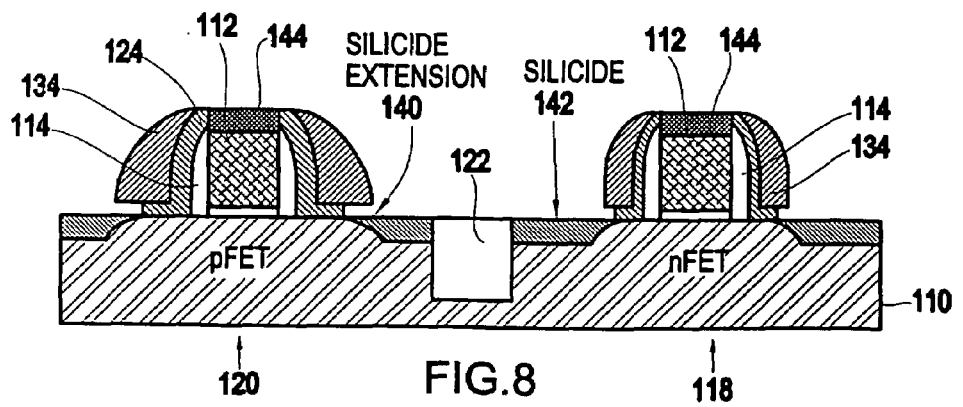
FIG. 8 is a schematic diagram of a partially completed complementary transistor structure according to the invention.
Figure 9:
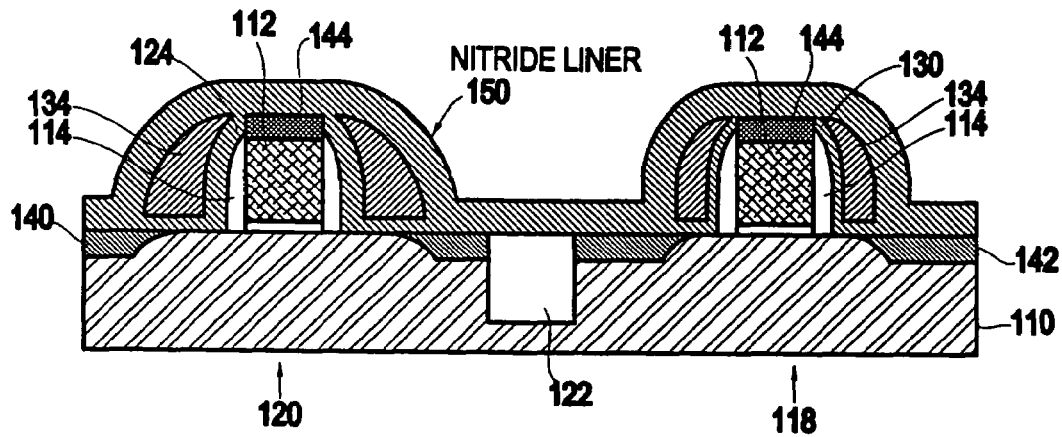
FIG. 9 is a schematic diagram of a partially completed complementary transistor structure according to the invention.

FIG. 7 shows that the wafer is wet cleaned in HF chemicals as normally required before silicide (e.g., cobalt) formation. The amount of recess of oxide 138 under the spacer nitride 134 is determined by the oxide 124 thickness in the PFET device 120. The same is true for the NFET device 118. Since the NFET has a thinner oxide layer 130 it has a thinner recess 136. FIG. 8 shows that metal is sputtered and silicidation anneals are performed to form silicide over the gate poly 144 and source/drain regions. Some metal is sputtered into the recess under the spacers to form a shallow silicide (item 140 for the PFET devices 120 and item 142 for the NFET devices 118) in the extension regions to reduce series resistance. The contact etch stopping layer 150 is deposited, as shown in FIG. 9, and additional, well-known process steps are performed to complete the structure.

Figure 10:
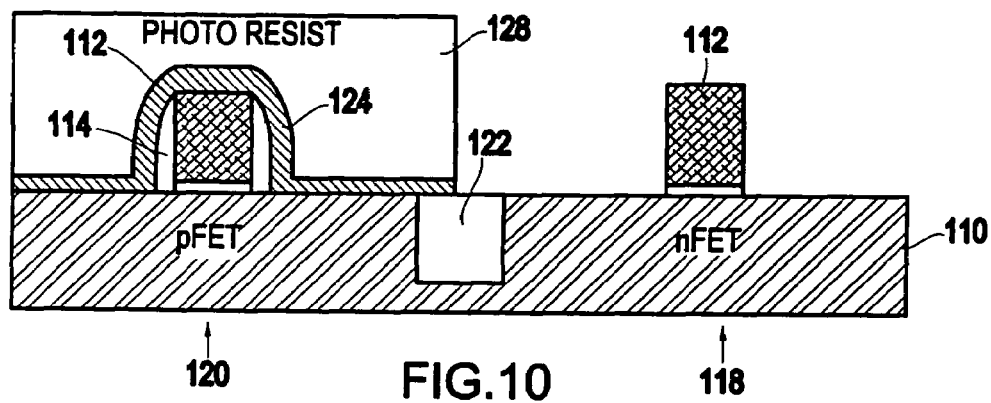
FIG. 10 is a schematic diagram of a partially completed complementary transistor structure according to the invention.
Figure 11:
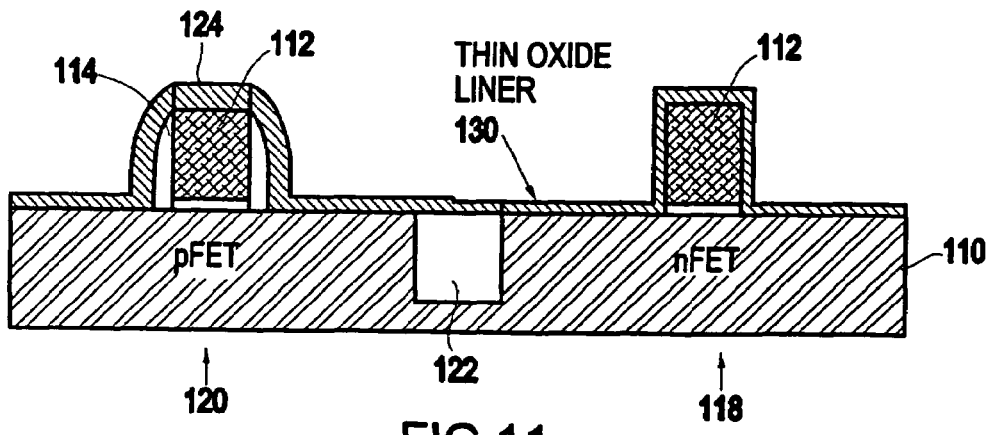
FIG. 11 is a schematic diagram of a partially completed complementary transistor structure according to the invention.
Figure 12:
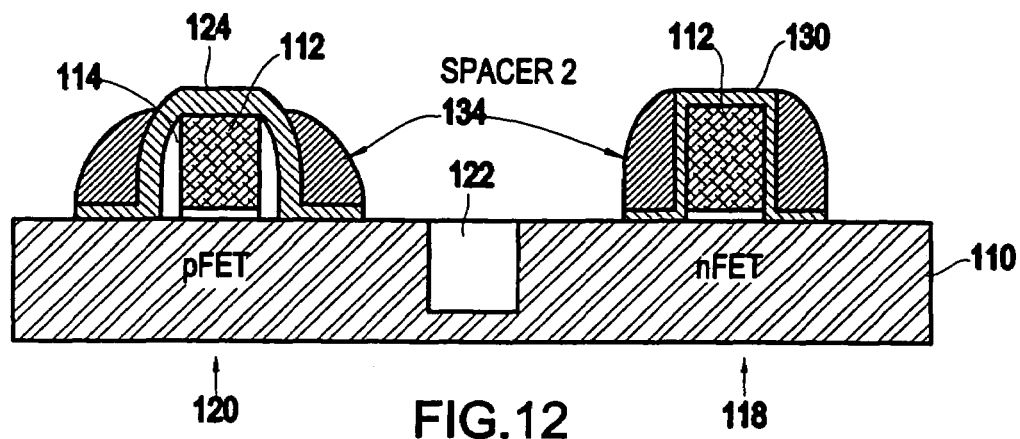
FIG. 12 is a schematic diagram of a partially completed complementary transistor structure according to the invention.
Figure 13:
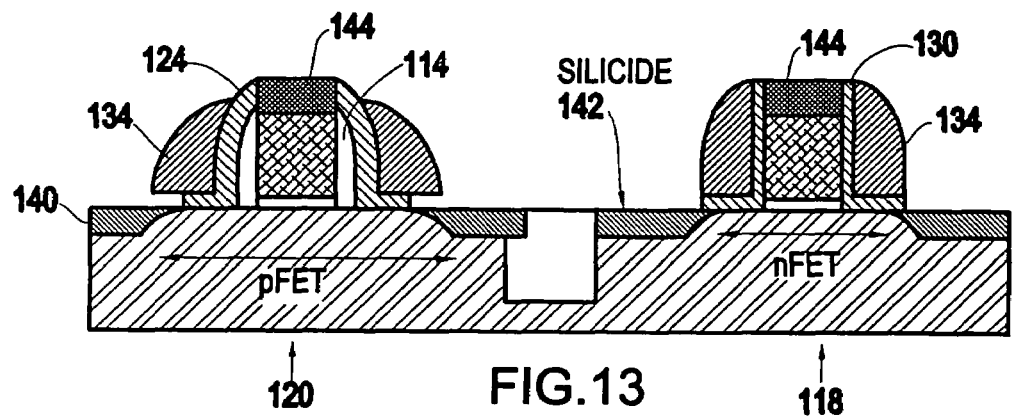
FIG. 13 is a schematic diagram of a partially completed complementary transistor structure according to the invention.

In the second embodiment, shown in FIGS. 10-13, the NFET 118 oxide spacer 124 may be thinned or completely removed (as shown in FIG. 10) to further reduce NFET extension length. More specifically, FIG. 10 shows that the NFET 118 thin oxide layer 114 and oxide spacer 124 is etched using, for example, HF containing chemicals. Again, a thick oxide (such as 50 A thick LTO) 130 is deposited after the photoresist 128 is removed in FIG. 11. The Si3N4 spacer 134 is formed in FIG. 12. With this embodiment, an even shorter NFET extension is realized. FIG. 13 shows the structure after the silicidation is performed, which again reduces extension resistance for both NFET and PFET devices.

Figure 14:
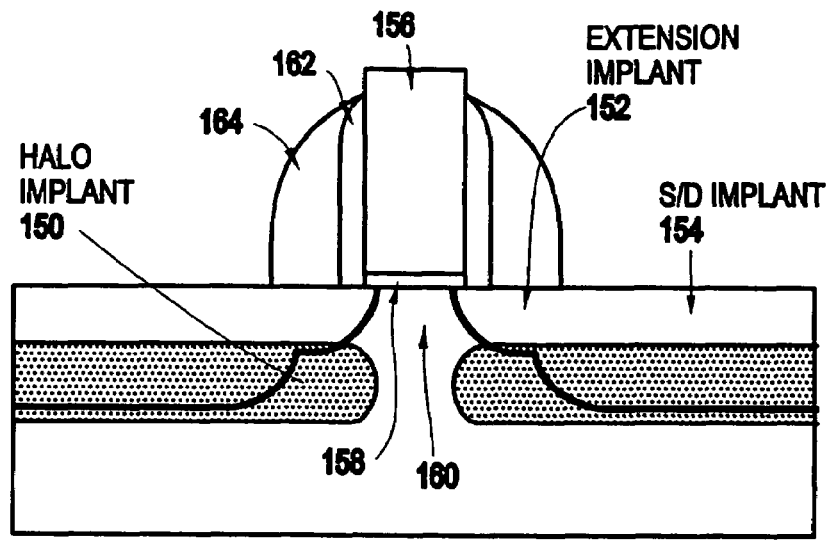
FIG. 14 is a schematic diagram showing common doping profiles of field effect transistors.

FIG. 14 shows a standard doping profile for a field effect transistor and is included to show the position of source/drain extensions 152 with respect to conventional source/drain implants 154, as well as the conventional halo implant 150. FIG. 14 also illustrates the gate conductor 156, gate oxide 158, channel region 160, and insulating sidewall spacers 162, 164. Such structures are well-known and, therefore, the details regarding these structures and their associated manufacturing processes are intentionally omitted so as to focus the reader's attention on the salient features of the invention.

Figure 15:
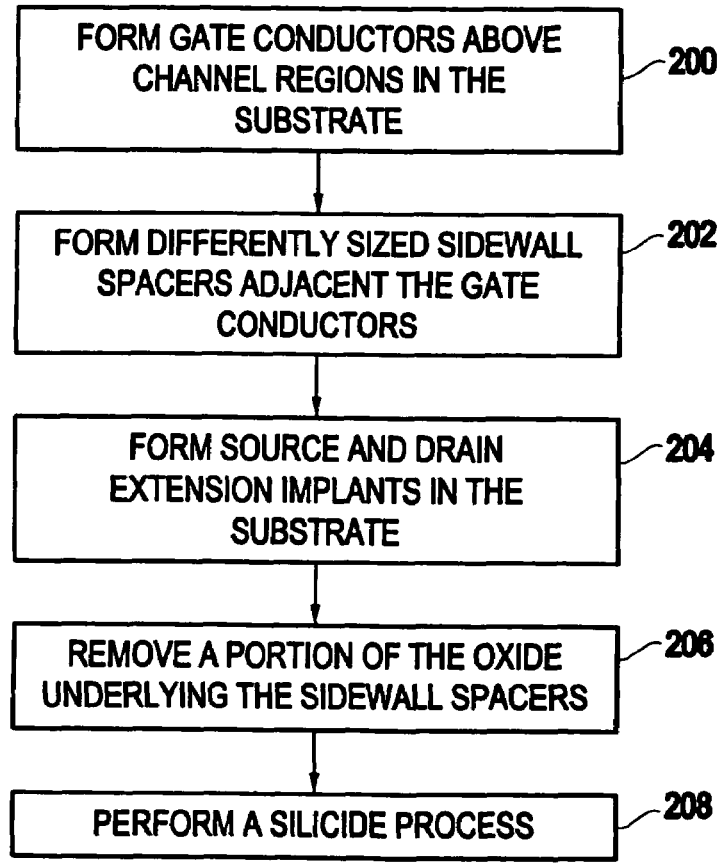
FIG. 15 is a flow diagram illustrating a preferred method of the invention.

FIG. 15 is a flow chart illustrating the inventive method of forming an integrated circuit structure having first-type transistors, such as P-type field effect transistors (PFETs) and complementary second-type transistors, such as N-type field effect transistors (NFETs) on the same substrate. More specifically, the invention forms gate conductors above channel regions in the substrate 200. Next, the invention forms differently sized sidewall spacers adjacent the gate conductors 202, and forms source and drain extension implants in the substrate 204. The sidewall spacers are larger (extend further from the gate conductor) in the PFETs than in the NFETs. The sidewall spacers align the source and drain extensions during the implanting process. Therefore, the larger sidewall spacers position (align) the source and drain implants further from the channel region for the PFETs when compared to the NFETs.

Then, during the subsequent annealing processes, the faster moving PFET impurities will be restrained from diffusing too far into the channel region under the gate conductor. This prevents the short channel effect that occurs when the source and drain impurities extend too far beneath the gate conductor and short out the channel region.

The process of forming the sidewall spacers can include forming an oxide liner, where the oxide liner is thicker in the PFETs than in the NFETs. Such oxide liners for the PFETs are formed in a different processing step than oxide liners for the NFETs. Additionally, the process of forming the sidewall spacers can include forming multiple-layer sidewall spacers, wherein the sidewall spacers in the PFETs have more sidewall spacer layers than in the NFETs. Both these processes make the sidewall spacers thicker in the PFETs than in the NFETs.

The invention also forms silicide regions between portions of the sidewall spacers and the substrate. More specifically, the invention removes a portion of the oxide underlying the sidewall spacers 206 and then performs a silicide process 208 that forms silicide regions under portions of the sidewall spacers. The silicide regions are larger in the first-type transistors than in the second-type transistors.

Thus, the invention forms a complementary integrated circuit structure having first-type transistors and complementary second-type transistors on the same substrate. With the invention, the sidewall spacers are larger (extend further from the gate conductor) in one type of transistor. The sidewall spacers align the source and drain extensions during the implanting process. Therefore, the larger sidewall spacers position (align) the source and drain implants further from the channel region for one type of transistor when compared to the other type of transistor. Then, during the subsequent annealing processes, the faster moving impurities will be restrained from diffusing too far into the channel region under the gate conductor. This prevents the short channel effect that occurs when the source and drain impurities extend too far beneath the gate conductor and short out the channel region.

Moreover, silicide formed under the PFET spacer reduces series resistance of the PMOS transistor so that its performance is improved. The formation of the silicide under the PMOS spacer is feasible due to the fact that P type dopant diffuses faster and hence forms a relatively deeper extension region, which prevents high junction leakage between P-type silicon and silicide.

While the invention has been described in terms of preferred embodiments, those skilled in the art will recognize that the invention can be practiced with modification within the spirit and scope of the appended claims.

What is claimed is:

1. A method of forming an integrated circuit structure having first-type transistors and second-type transistors on a same substrate, said method comprising:
   forming gate conductors above channel regions in said substrate;
   forming sidewall spacers adjacent said gate conductors, wherein said sidewall spacers are larger in said first-type transistors than in said second-type transistors;
   forming source and drain extensions in said substrate; and
   forming silicide regions between portions of said sidewall spacers and said substrate, wherein said silicide regions are larger in said first-type transistors than in said second-type transistors.

2. The method in claim 1, wherein said process of forming said source and drain extensions forms said source and drain extensions further from said channel regions in said first-type transistors than in said second-type transistors.

3. The method in claim 1, wherein said process of forming said source and drain extensions comprises implanting said source and drain extensions, wherein said sidewall spacers align said source and drain extensions during said implanting process.

4. The method in claim 3, wherein said process of forming said sidewall spacers includes forming a multiple-layer sidewall spacers, wherein said sidewall spacers in said first-type transistors have more sidewall spacer layers than in said second-type transistors.

5. The method in claim 1, wherein said process of forming said sidewall spacers includes forming an oxide liner, wherein said oxide liner is thicker in said first-type transistors than in said second-type transistors.

6. The method in claim 5, wherein oxide liners for said first-type transistors are formed in a different processing step than oxide liners for said second-type transistors.

7. A method of forming an integrated circuit structure having P-type field effect transistors (PFETs) and N-type field effect transistors (NFETs) transistors on a same substrate, said method comprising:
   forming gate conductors above channel regions in said substrate;
   forming sidewall spacers adjacent said gate conductors, wherein said sidewall spacers are larger in said PFETs than in said NFETs;
   forming source and drain extensions in said substrate; and
   forming silicide regions between portions of said sidewall spacers and said substrate, wherein said silicide regions are larger in said PFETs than in said NFETs.

8. The method in claim 7, wherein said process of forming said source and drain extensions forms said source and drain extensions further from said channel regions in said PFETs than in said NFETs.

9. The method in claim 7, wherein said process of forming said source and drain extensions comprises implanting said source and drain extensions, wherein said sidewall spacers align said source and drain extensions during said implanting process.

10. The method in claim 9, wherein said process of forming said sidewall spacers includes forming a multiple-layer sidewall spacers, wherein said sidewall spacers in said PFETs have more sidewall spacer layers than in said NFETs.

11. The method in claim 7, wherein said process of forming said sidewall spacers includes forming an oxide liner, wherein said oxide liner is thicker in said PFETs than in said NFETs.

12. The method in claim 11, wherein oxide liners for said PFETs are formed in a different processing step than oxide liners for said NFETs.

* * * * *